US008735781B2

(12) United States Patent
Shimao et al.

(10) Patent No.: US 8,735,781 B2
(45) Date of Patent: May 27, 2014

(54) METHOD AND APPARATUS FOR CONTROLLING HEATING AND COOLING OF TRANSFER UNIT IN PRECISION HOT PRESS APPARATUS

(75) Inventors: Daisuke Shimao, Tainai (JP); Takashi Kurata, Sekikawa (JP)

(73) Assignee: Hitachi Industrial Equipment Systems Co., Ltd., Tokyo (JP)

(*) Notice: Subject to any disclaimer, the term of this patent is extended or adjusted under 35 U.S.C. 154(b) by 876 days.

(21) Appl. No.: 12/690,947

(22) Filed: Jan. 21, 2010

(65) Prior Publication Data

US 2010/0307732 A1   Dec. 9, 2010

(30) Foreign Application Priority Data

Jun. 5, 2009   (JP) .................. 2009-135874

(51) Int. Cl.
*F25B 29/00*   (2006.01)
*H05B 6/02*   (2006.01)

(52) U.S. Cl.
USPC ........ 219/483; 219/200; 219/270; 219/443.1; 219/553; 219/618

(58) Field of Classification Search
USPC .................................................. 219/618, 483
See application file for complete search history.

(56) References Cited

U.S. PATENT DOCUMENTS

| 2003/0136260 A1 | 7/2003 | Sano et al. | |
| 2003/0202828 A1* | 10/2003 | Lee | 399/330 |
| 2006/0083530 A1* | 4/2006 | Bartley et al. | 399/70 |
| 2006/0228248 A1* | 10/2006 | Larsson | 419/6 |
| 2006/0291894 A1* | 12/2006 | Chung et al. | 399/92 |
| 2007/0047990 A1* | 3/2007 | Lemaster et al. | 399/69 |

FOREIGN PATENT DOCUMENTS

| DE | 40 40 352 A1 | 7/1992 |
| EP | 0 388 863 A2 | 9/1990 |
| JP | 08-332637 | 12/1996 |
| JP | 11-291300 | 10/1999 |
| JP | 2002-157024 | 5/2002 |
| JP | 2005-329577 | 12/2005 |
| JP | 2009-045814 | 3/2009 |
| JP | 2010-089136 | 4/2010 |

OTHER PUBLICATIONS

European Search Report for Application No. EP 10 00 0595 dated Jul. 2, 2013.

* cited by examiner

*Primary Examiner* — Alexander Sofocleous
*Assistant Examiner* — John P Dulka
(74) *Attorney, Agent, or Firm* — Antonelli, Terry, Stout & Kraus, LLP.

(57) ABSTRACT

A method and apparatus for controlling heating and cooling of a transfer unit in a precision hot press device configured to suppress overheating and supercooling, and of performing quick heating and cooling, wherein the method and apparatus compares an amount of energy given to the transfer unit or taken from the transfer unit by a heating unit or a cooling unit with an amount of energy observed to enter into or exit from the transfer unit before the temperature of the transfer unit reaches a target temperature, calculates an amount of surplus or supercooled energy from a difference between the two energy amounts, and heats or cools the transfer unit based on the amount of surplus or supercooled energy.

4 Claims, 5 Drawing Sheets

METHOD AND APPARATUS FOR CONTROLLING HEATING AND COOLING OF TRANSFER UNIT IN PRECISION HOT PRESS APPARATUS

INCORPORATION BY REFERENCE

The present application claims priority from Japanese application JP 2009-135874 filed on Jun. 5, 2009, the content of which is hereby incorporated by reference into this application.

BACKGROUND OF THE INVENTION

The present invention relates to a method and apparatus for controlling heating and cooling of a transfer unit, which is applied to a precision hot press device capable of highly flat and microstructure transfer, and is particularly applied to a microstructure transfer mold and a microstructure transfer device. The microstructure transfer mold and microstructure transfer device press an original plate (microstructure transfer mold), which is formed with a fine rugged pattern on the surface thereof and serves as a transfer source, against a substrate (transferred body) to which the pattern is transferred, thus transferring and forming the fine rugged pattern on the surface of the substrate. More particularly, the present invention relates to a method and apparatus for controlling temperatures of the transfer unit that enables quick heating and cooling during a microstructure thermal transfer process.

For a thermal nano imprint device for performing the foregoing microstructure thermal transfer, a relatively-inexpensive nano-level imprint device is currently on the market. The microstructure transfer device is capable of nano-level transfer, and is generally referred to as a nano imprint device. The transfer unit of the nano imprint device comprises various functions. The best example thereof is heating and cooling functions. Here, the transfer unit requires a submicron-level of surface precision. Therefore, typically, each mechanism for implementing the heating function and cooling function is integrally molded with the transfer unit.

Heating and cooling are essential for the thermal nano imprint device in order to perform the thermal transfer. In performing the thermal transfer, capabilities to control temperatures highly precisely and uniformly, and to perform heating and cooling quickly are necessary. Here, heating mechanisms include one that employs a heater such as a heating wire, a lamp, or an electromagnetic induction. Cooling mechanisms include one that flows a cooling medium (e.g., water, gas, and oil) in a cooling path, or a means for putting the heating and cooling mechanism itself in a cooling chamber. As a specific example of the heating mechanism and cooling mechanism, a scheme is used that flows a heating medium or a cooling medium through a block body (heater plate) which is configured to be attached with a heating source or a cooling source. Typically, for the temperature control of the heating and cooling mechanism, a programmable air conditioner is employed that is commercially available. Some temperature control technologies, which are not limited only for the thermal nano imprint device, are disclosed in JP-A-2002-157024 and JP-A-2005-329577.

The temperature control scheme disclosed in the patent documents or the temperature control employing a commercially available programmable air conditioner typically measures a change in temperature from a current temperature to a target temperature as well as a time required to reach the target temperature, and controls a heating output and a cooling output based on the result of the measurement. These temperature control schemes are capable of controlling temperatures highly precisely. However, since these schemes perform the temperature control from a change in temperatures, there arises a time lag between the temperature measured after heat is transferred and controlling of output. This is because of the quality of the material and cubic volume of the heating and cooling mechanism. As a result, the heat output is more suppressed as the current temperature gets closer to the target temperature, thus making it difficult to perform quick temperature control.

As for the thermal nano imprint device, there is one that is earlier proposed by the present applicant in a patent application No. 2008-262699. FIG. 5 is a cross-sectional diagram representing an example of the thermal nano imprint device as a precision press device. Basically, the thermal nano imprint device comprises: a pressure receiving portion 511 which is fixed to one end each of a plurality of (three or four in this case) guide posts 514a, 514b (hereinafter collectively referred to as 514. Other components are also referred to in the same collective manner) that are disposed in parallel with each other; a pressure portion 512 disposed to oppose the pressure receiving portion 511 and to be able to move toward and away from the pressure receiving portion 511 by sliding on the guide posts 514; and a drive portion 518 for driving the pressure portion 512 towards the pressure receiving portion 511 via a free bearing 519. The pressure portion 512 and drive portion 518 are not bolt-fixed. Instead, they are attached to be somewhat rockable like a stripper bolt, a damper, or a spring, and are placed on the free bearing 519. For a drive source of the drive portion 518, a servo motor, an air cylinder, a hydraulic cylinder, and the like can be used.

The pressure receiving portion 511 is fixed to the guide posts 514 by adjustable nuts 513. The adjustable nuts 513 are capable of adjusting the mounting height of the pressure receiving portion 511 relative to the guide posts 514 in the level of 1/100 mm during assembly. Even after assembly, the adjustable units 513 are capable of adjusting the flatness of the pressure receiving portion 511 in the nano level. Thus, the pressure receiving portion 511 is uniformly guided by the guide posts 514.

The pressure portion 512 is disposed to be able to slide on the guide posts 514 via retainers 515 and elastic bodies 516. The cylindrically shaped elastic bodies 516 made of urethane resin are fixed in such a manner that they are fitted into sliding holes formed on the pressure portion 512. A direct-acting guide bearing formed into a cylindrical shape or the like, for example, can be used for the retainers 515 which are fitted into the cylindrical interior of the elastic bodies 516, thus making it possible to exhibit high precision alignment until a forming die contacts an object to be transferred. The elastic bodies 516 are provided with flange portions on one end side thereof, which abut the upper surfaces of the pressure portion 512. The retainers 515 are provided with flange portions on one end side thereof, which abut the flange portions of the elastic bodies 516, thus each being positioned in the axial direction. The retainers 515 are slidable on the guide posts 514 which are inserted into the cylindrical interiors of the retainers, and, as a result, the pressure portion 512 is slidable on the guide posts 514 via the retainers 515 and elastic bodies 516.

The pressure receiving portion 511 and pressure portion 512 are provided with press stages 517a, 517b, respectively, on their surfaces opposite to each other. A micromachined original plate is disposed on one surface of each of the press stages 517a, 517b, and a substrate is disposed on the other surface of each of the press stages 517a, 517b. During a pressing process, the original plate is pressed against the substrate. As a result, a micromachined pattern of the original plate is transferred onto the substrate. The press stages 517a, 517b, which support the original plate or the substrate, constitute a transfer unit having a heating and cooling mechanism for heating or cooling the original plate or substrate.

The elastic bodies 516 installed to the guide posts 514 are members for adjusting the flatness to a nano level during a pressing process. The elastic bodies 516 are configured to retain an entire ram of the pressure portion 512, and thereby to retain the press stage 517b or the entire pressure portion 512, absorb the inclination and deflection of the pressure portion 512, such that the pressure portion 512 follows the pressure receiving portions 511.

When the present precision hot press device operates, the drive portion 518 for driving the pressure portion 512 presses the pressure portion 512 via the free bearing 519. A tip of the free bearing 519 is spherically shaped, and, when the press device operates, the pressure portion 512 follows the pressure receiving portion 511. That is, even if the press stages 517a, 517b, which will be described later, follow each other due to the elastic deformation of the elastic bodies 516, it is possible to apply a load to the pressure portion 512 at a single point. During a pressing process, the elastic deformation of the elastic bodies 516 absorbs relative inclination and deflection of the pressure receiving portion 511 and pressure portion 512. As a result, following condition between the pressure receiving portion 511 and the pressure portion 512 is maintained, and the press stage 517 is uniformly loaded, thus making it possible to perform press molding precisely enough to achieve a high-flatness.

Elimination of an influence of heat accumulated in a plastic mold is proposed in JP-A-08-332637. According to the proposition, the influence is eliminated by using a non-contact temperature sensor that is disposed near the surface of the metal mold, and by setting the mold and a noncontact air as a reading point in a plastic mold that uses a metal mold. A method of quickly and precisely controlling the temperature on the surface of a metal mold is proposed in JP-A-11-291300. According to the proposition, the quick and precise temperature control is achieved by directly incorporating a temperature detection sensor within a mold surface material layer of a metal mold and by bringing the temperature detection sensor as close as possible to the surface of the mold thereby to unify it with the mold surface material layer in a plastic injection mold employing a metal mold for plastic injection molding. Furthermore, a method of controlling to cool the temperature of a metal mold, before it is injection-molded, to a solidification temperature is proposed in JP-A-2009-45814. According to the proposition, it is achieved by changing a heating heat medium from water vapor, which is originally used, to high-temperature water, and subsequently changing it to cooling water after the injection.

As explained in the above, in the precision hot press device, as a microstructure transfer mold and a microstructure transfer device for transferring and forming fine rugged patterns on the surface of a substrate, the substrate is softened during the transferring and forming of the rugged pattern, and after the transfer, the substrate is cooled and thereby the rugged pattern is hardened and finalized. In order to enhance the productivity of the microstructure transfer of the precision press device, it is necessary to perform the heating and cooling of the transfer unit, which is repeatedly conducted by the heating and cooling mechanism, as rapidly as possible. In reducing the time required to heat and cool the transfer unit in the precision hot press device, as much as possible, there are some problems to be solved concerning the management of entrance and exit of heat conducted by the heating and cooling mechanism.

SUMMARY OF THE INVENTION

It is an object of the present invention to provide a method and apparatus for controlling the heating and cooling of a transfer unit in a precision hot press device that reduces the time required by a heating and cooling mechanism to thereby improve productivity thereof.

In order to solve the above problem and achieve the object, the method of controlling the heating and cooling of the transfer unit in the precision hot press device according to the present invention, in heating and cooling the precision hot press device for heating and cooling the transfer unit that performs microstructure thermal transfer to a substrate, when heating or cooling the transfer unit to a target temperature, compares the energy amount given to the transfer unit by the heating or the energy amount taken from the transfer unit by the cooling with the energy amount observed to enter into or exit from the transfer unit before the temperature of the transfer unit reaches a target temperature, calculates the amount of surplus or supercooled energy from a difference between the two energy amounts, and heats or cools the transfer unit based on the amount of surplus or supercooled energy.

Moreover, the apparatus for controlling the heating and cooling of the transfer unit in the precision hot press device according to the present invention comprises: a transfer block for supporting the transfer unit that performs microstructure thermal transfer to the substrate to ensure that heat is transferred; a heating means for heating the transfer block and a cooling means for cooling the transfer block; a temperature sensor for monitoring the temperature of the transfer block; and a control means for controlling the heating means and the cooling means in accordance with the temperature of the transfer block detected by the temperature sensor, wherein the control means, when heating or cooling the transfer unit to the target temperature, compares the energy amount given to the transfer unit by the heating or the energy amount taken from the transfer unit by the cooling with the energy amount observed to enter into or exit from the transfer unit before the temperature of the transfer unit reaches the target temperature, calculates the amount of surplus or supercooled energy from the difference between the two energy amounts, and heats or cools the transfer unit based on the calculated amount of surplus or supercooled energy.

According to the control of the heating and cooling of the transfer unit in the precision press device of the present invention, the amount of energy (amount of heat) given to or taken from by the heating means or by the cooling means is compared with the energy amount observed to enter into or exit from the transfer unit before the temperature of the transfer unit reaches the target temperature, the amount of surplus or supercooled energy is calculated, and then the transfer unit is heated or cooled based on the amount of surplus or supercooled energy. Therefore, the temperature of the transfer unit is controlled based on the heating or cooling actually provided, thus making it possible to quickly perform control such that the temperature of the transfer unit reaches the target temperature.

The method and apparatus for controlling the heating and cooling of the transfer unit in the precision press device according to the present invention is capable of quickly performing control such that the temperature of the transfer unit reaches the target temperature by heating and cooling the transfer unit based on the amount of surplus or supercooled energy on the transfer unit. As a result, in a precision hot press device such as a thermal nano imprint device, it is possible to reduce a time period required for heating and cooling processes of the transfer unit, which are repeated for each microstructure transfer, thus making it possible to increase the productivity of the microstructure transfer.

Other objects, features and advantages of the invention will become apparent from the following description of the embodiments of the invention taken in conjunction with the accompanying drawings.

DESCRIPTION OF THE EMBODIMENTS

Now, description will be given to embodiments of the method and apparatus for controlling the heating and cooling of the transfer unit used for the precision hot press device that is capable of quickly performing heating and cooling according to the present invention with reference to accompanied drawings in the below.
(Embodiments)

Figure 1A:
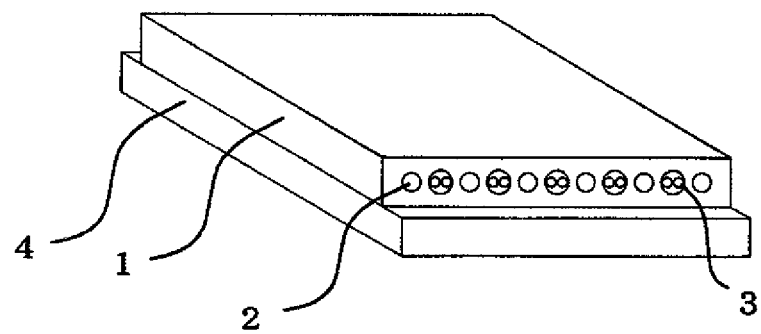
FIGS. 1A-1C are schematic perspective diagrams illustrating an example of a heating and cooling mechanism for a transfer unit in a precision hot press device according to the present invention.
Figure 1B:
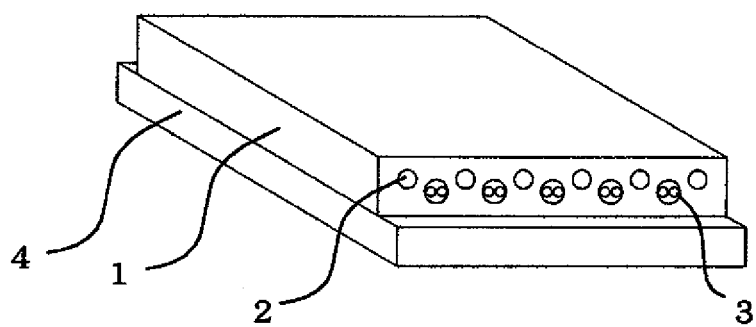
Figure 1C:
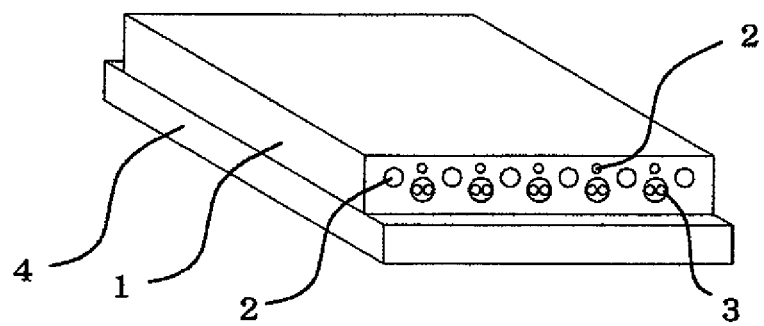
Figure 5:
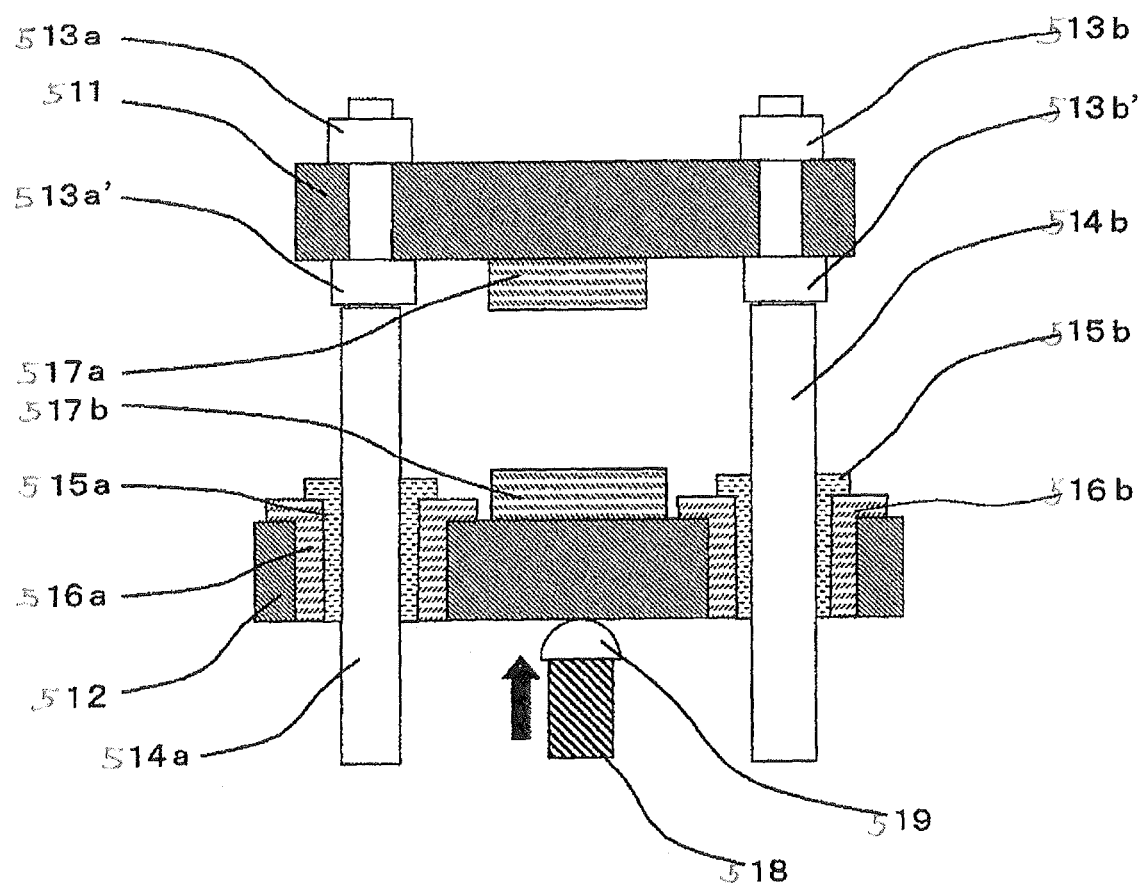
FIG. 5 is a vertical cross-sectional diagram showing an example of principal parts including the transfer unit of the precision hot press device according to a previous proposition.

Embodiments of the method and apparatus for controlling the heating and cooling of the transfer unit in the precision hot press device according to the present invention will be explained with reference to FIGS. 1A-1C. FIGS. 1A-1C are schematic perspective diagrams illustrating examples, in which the heating and cooling of the transfer unit in the precision hot press device is controlled, according to the present invention. Since the structure of the principal parts including the transfer unit of the precision hot press device is the same as that illustrated, for example, in FIG. 5, another explanation thereof is omitted here. The transfer unit comprises a heating and cooling mechanism 1 and a heat insulation unit 4, and is structured not to externally dissipate thermal energy generated in the heating and cooling mechanism 1. The heating and cooling mechanism 1 is formed with cooling paths 2 for flowing a heating medium 3 and a cooling medium.

In the heating and cooling mechanism 1, a plurality of cooling paths 2 are disposed uniformly and alternatingly with a purpose of uniformalizing the temperature on the surface of the transfer unit. There are several alignments of the heating media 3 and cooling paths 2 as shown in FIGS. 1A-1C. FIG. 1A shows a structure in which the cooling paths 2 sandwich the heating media 3. FIG. 1B shows a structure in which the cooling paths 2 are disposed to deviate towards a transfer surface away from the heating media 3. FIG. 1C shows a structure in which other cooling paths 2 with smaller diameter are disposed between the transfer surface of the heating and cooling mechanism 1 and the heating media 3. This structure enables suppression of heat generation at the heating media 3 and improvement of the thermal response to the transfer surface. These structures all function to cancel the excessive thermal energy produced from the heating media 3 or to perform quick cooling. It should be noted that a mechanism for performing uniform heating and cooling is under research and development separately, and that the present invention does not intend to limit the heating and cooling mechanism to the heating and cooling mechanism 1 illustrated in FIGS. 1A-1C as long as the heating media 3 and cooling paths 2 are installed to the heating and cooling mechanism.

Next, a method of rapidly controlling the heating in the heating and cooling mechanism 1 will be explained below with reference to FIGS. 2 and 3.

Figure 2:
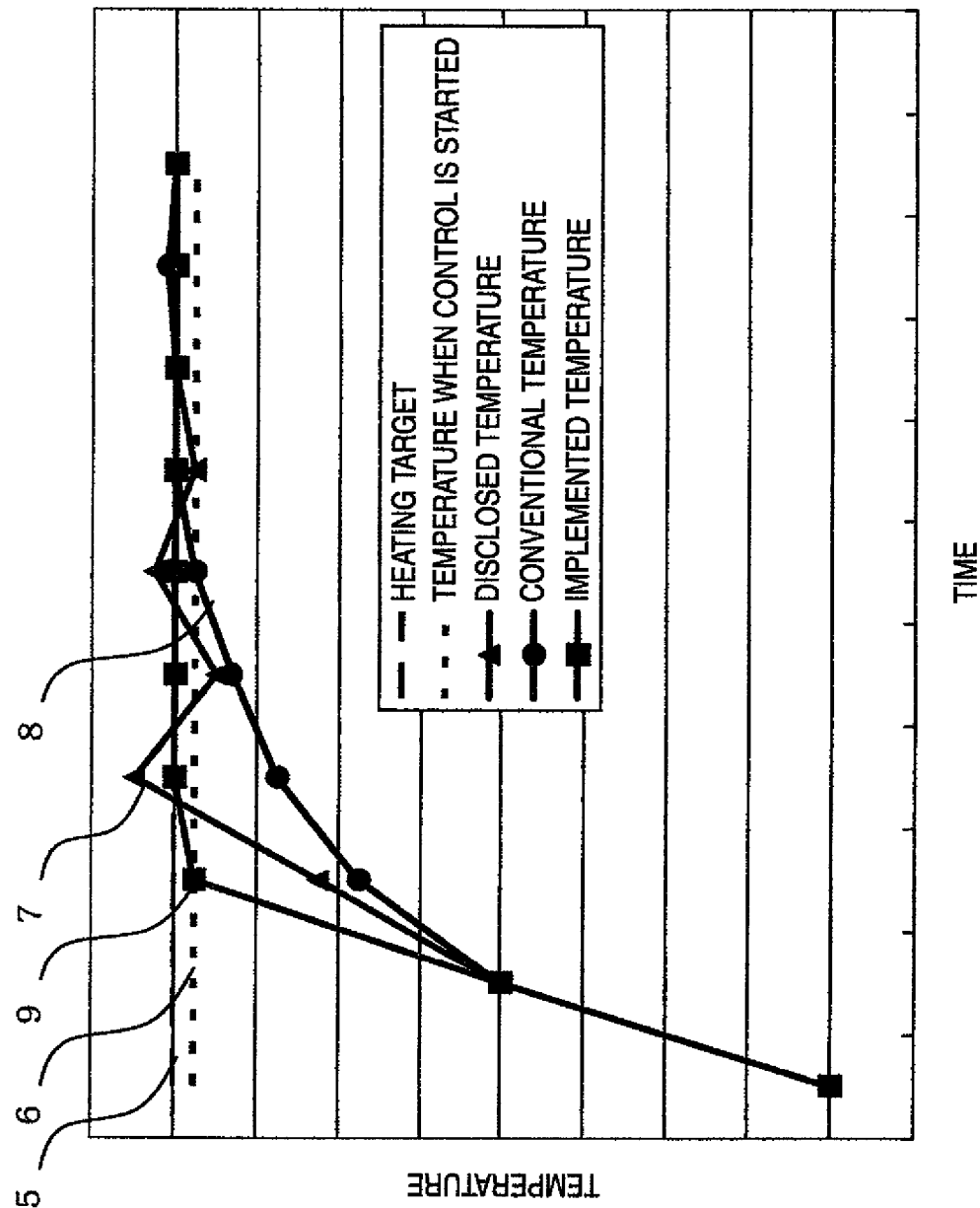
FIG. 2 is a graph showing changes in temperatures of the transfer unit during a heating process in control of the heating and cooling of the transfer unit illustrated in FIGS. 1A-1B.
Figure 3:
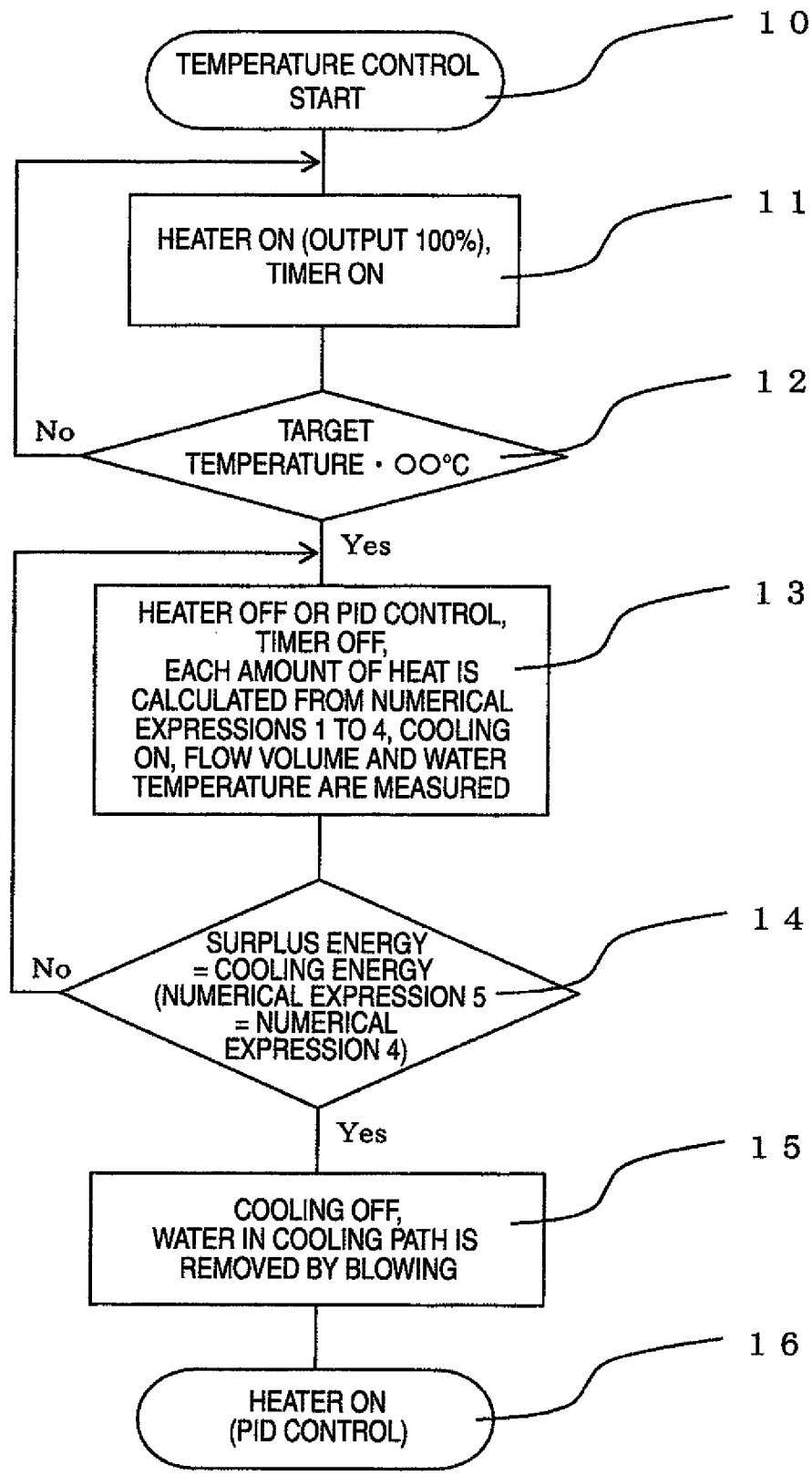
FIG. 3 is a flow chart showing an example of the method of controlling the heating and cooling of the transfer unit in the precision hot press device according to the present invention.

FIG. 2 is a graph illustrating temperature-time change curves, wherein 7 shows a temperature control by a disclosed technique, 8 is a temperature control by a conventional technique, and 9 is a temperature control by the present invention. FIG. 3 is a flow chart according to the present invention.

The procedure of controlling the heating of the transfer unit in the precision hot press device according to the present invention will be described along the temperature control flow chart illustrated in FIG. 3. First, a heater capacity (W), an amount of specific heat (integrated value of weight and specific heat C), and a cooling capacity are previously calculated (step 10). Second, heating starts while the output level of a heater is set (manually controlled) to 100% (step 11). A temperature monitor sensor such as a thermocouple is installed to the heating and cooling device 1. At a point of time when a value monitored by the temperature monitor sensor starts from a target temperature 5 (for example, −5 degrees Celsius during heating and +5 degrees Celsius during cooling) and reaches a predetermined temperature 6 (step 12), the heater is set to automatic control (control of each of PID (proportion (P), integration (I), and differentiation (D)) or output is turned off (step 13).

At this time, starting from the time when the heater is turned on, a volume of work conducted by the heater (amount of thermal energy given to the transfer unit), an observed volume of work (amount of thermal energy), and an amount of dissipated heat are calculated according to numerical expressions 1 to 3 given below. The amount of excessive thermal energy generated in the heating and cooling mechanism 1, as shown by a numerical expression 4, is obtained by subtracting the numerical expression 2 (observed volume of work) and the numerical expression 3 (amount of dissipated heat) from the numerical expression 1 (volume of work conducted by the heater). This energy is inherent in the heating and cooling mechanism 1 as the excessive thermal energy. Therefore, leaving the energy as it is would result in the transfer unit being overheated.

Here, control is performed to suppress the overheating by generating minus energy having an amount of energy equivalent to that of the excessive thermal energy (step 14). In other words, the excessive thermal energy is cancelled by flowing a cooling medium into the cooling paths 2. One embodiment of calculation of the amount of energy lost by cooling is described by a numerical expression 5 (in addition, there is Newton's law of cooling or the like). If the cooling medium is left remaining in the cooling paths 2 after the cancellation of the excessive energy, the thermal energy is lost due to a difference in temperature between the heating and cooling mechanism 1 and the cooling medium. Therefore, air blowing is carried out to remove the cooling medium from the cooling paths 2 (step 15). As a final step (step 16), since there exists a small difference between the calculated value and an actually measured value, temperature control is performed by PID-controlling the heating medium 3 by means of air-condition equipment, thus quick heating control being completed. The final step by the PID control is necessary for performing highly precise temperature control.

More highly precise temperature control can be achieved by considering heat dissipation, latent heat, work efficiency and safety factor of a heater and cooling equipment, and the amount of thermal energy removed by air blowing or the like in the numerical expressions 1 to 5. However, it is an object of the present invention to quickly control heating, and the object can be achieved sufficiently through the use of the foregoing numerical expressions.

volume of work conducted by a heater (W·min)
=heater capacity (W)×heater ON time (Min) [Numerical expression 1]

observed volume work (W·min)=0.278×60 (Sec)× specific heat $C$ (Kj/kg·° C.)×heating mechanism's weight (kg)×raised temperature (t) [Numerical expression 2]

amount of heat dissipated in the heating and cooling mechanism unit (W·min)=(surface area excluding a heat retention unit (m^2)×heat loss coefficient 1 excluding heat retention unit (W/m^2)+ surface area of heat retention unit (m^2)×heat loss coefficient of the heat retention unit 2 (W/m^2)×heater ON time (min) [Numerical expression 3]

volume of work which is not transferred (W·min)= [numerical expression 1]−[numerical expression 2]−[numerical expression 3] [Numerical expression 4]

volume of work absorbed by water(W/min)=flow volume(L/min)×(temperature of the water that has flowed out T2(° C.)−temperature of the water before inflow T1(° C.) [Numerical expression 5]

Figure 4:
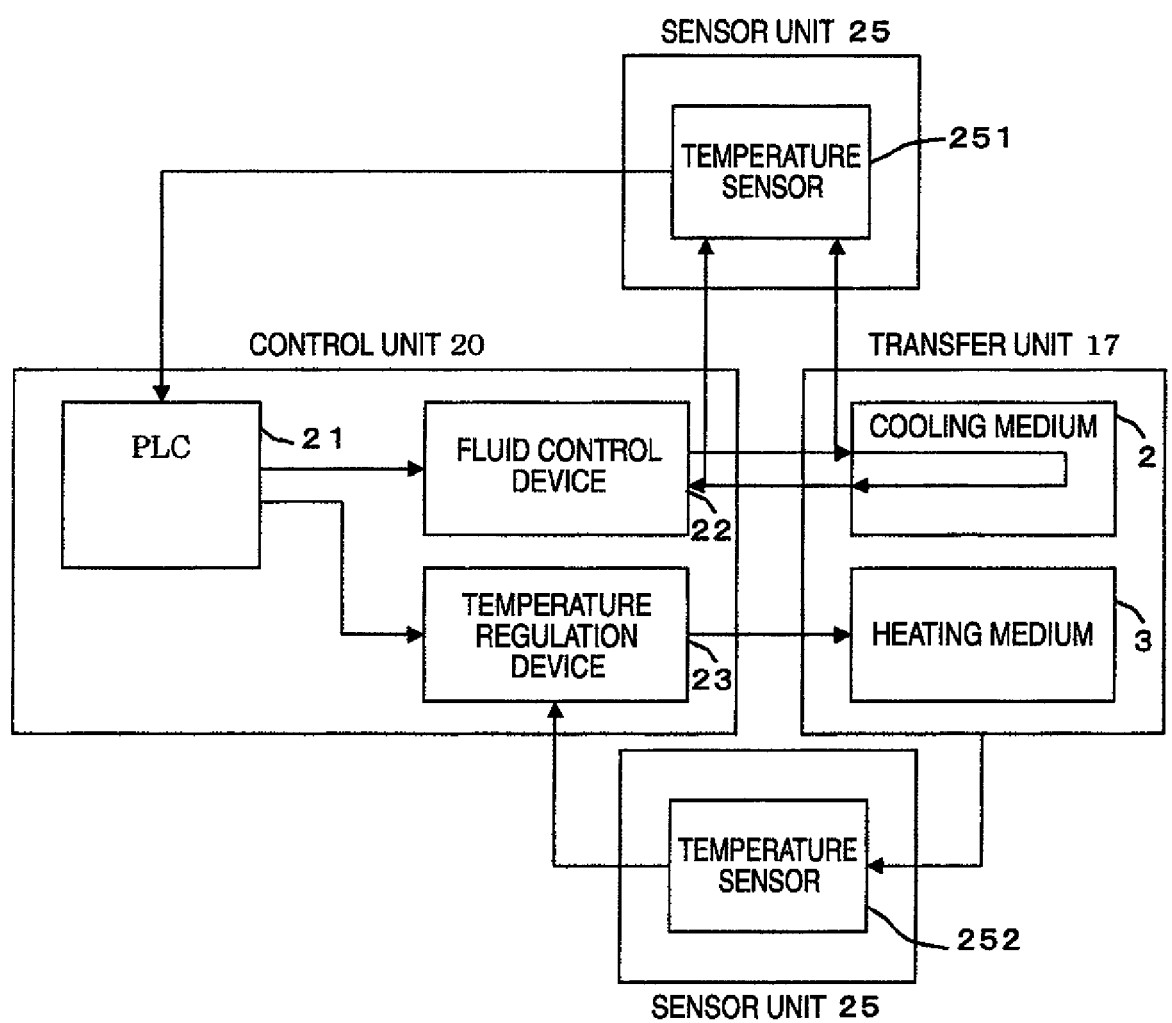
FIG. 4 is a control block diagram showing an example of the method of controlling the heating and cooling of the transfer unit in the precision hot press device according to the present invention.

In FIG. 4, an example of an apparatus for controlling the heating and cooling of the transfer unit in the precision hot press device according to the present invention is depicted as a control block diagram. The apparatus for controlling the heating and cooling depicted in FIG. 4 comprises: a control unit 20 for controlling the heating and cooling of a transfer unit 17; and a temperature sensor unit 25 for detecting the temperature of the transfer unit 17 and the temperature of a cooling medium flowing in cooling paths 2. The control unit 20 comprises: a programmable controller PLC21; and a flow control device 22 and a temperature regulation device 23 that are controlled by a control signal from the PLC21. The flow control device 22 controls the amount of cooling provided to the transfer unit 17 by controlling the flow of the cooling medium flowing in the cooling paths 2 of the heating and cooling mechanism 1. The temperature regulation device 23 controls the amount of heating provided to the transfer unit 17 by controlling the heating medium 3 of the heating and cooling mechanism 1. A temperature sensor 251 of the sensor unit 25 detects the temperature of the cooling medium before it flows into the transfer unit 17 (water temperature T1 (° C.) in the case of cooling water) and the temperature of the cooling medium after it flowed out of the transfer unit 17 (water temperature T2 (° C.)), and outputs the detection result (temperature difference) to the PLC 21. The sensor unit 25 also comprises a temperature sensor 252 for detecting the temperature of the transfer unit 17. "Observed volume of work" indicated by the numerical expression 2 is computed based on the temperature (raised temperature t) of the transfer unit 17 which is detected by the temperature sensor 252. "Volume of work to be absorbed by the cooled water" indicated by the numerical expression 5 is also computed on the basis of the temperatures of the cooling medium flowing in and out detected by the temperature sensor 251.

In order to optimize the position of the cooling paths 2 in the heating and cooling mechanism 1, it is possible to fabricate optimum cooling paths 2 by calculating temperature distribution from the dimensions and material (thermal transmission ratio) of the heating and cooling mechanism 1. Preferably, in case of heating, the cooling medium flowing in the cooling paths 2 is changed to one with a small thermal capacity (e.g., air, gas or the like) in order to reduce energy loss. Moreover, preferably, a cooling medium with a large thermal capacity (e.g., water or oil) is employed for reducing excessive energy or for performing cooling. The best mechanism would be one that is capable of switching between these cooling media according to the circumstances or of suspending flow instead of continuous flow.

As shown in FIG. 2, according to the temperature control of the present invention, the amount of surplus or supercooled energy is calculated before a target temperature is reached, by means of thermal calculation, and the transfer unit is heated or cooled based on the calculated amount of surplus or supercooled energy. Therefore, it is possible to prevent the transfer unit from being overheated or supercooled, and to achieve temperature control that enables getting closer and converging to the target temperature in a rapid manner, instead of overshooting the target temperature or gradually reaching the target temperature. Thus, it is possible to shorten the time required to heat and cool the transfer unit, which are repeated for each microstructure thermal transfer, and to improve productivity of fabricating the substrate of the precision hot press device.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of controlling use of a hot press device to fabricate a substrate with thermally transferred microstructures, the hot press device including a transfer unit configured to thermally transfer microstructures to a substrate, a heating unit configured to heat said transfer unit, a cooling unit configured to cool said transfer unit, a control unit configured to control said heating unit and said cooling unit, wherein when heating said transfer unit to a target temperature, said control unit performs the method of controlling use of a hot press device, comprising:

comparing an amount of energy given to said transfer unit by said heating unit with an amount of energy observed to enter into said transfer unit, when a temperature of said transfer unit reaches a temperature lower than said target temperature by a predetermined amount before the temperature of said transfer unit reaches said target temperature;

calculating an amount of surplus energy from a difference between said amount of energy given to said transfer unit and said amount of energy observed to enter into said transfer unit; and cooling said transfer unit such that said amount of surplus energy generated in said heating unit is cancelled by said cooling unit.

2. The method of controlling use of a hot press device according to claim 1, wherein said amount of surplus energy is calculated in consideration of an energy produced by radiation, an energy produced by latent heat, and an energy produced by a blowing as said amount of surplus energy, and thermal efficiency and safety factor.

3. A method of controlling heating of a transfer unit of a hot press device to a target temperature, for fabrication of a substrate to have thermally transferred microstructures, said transfer unit configured to thermally transfer microstructures to a substrate, wherein a control unit of said hot press device performs the method, comprising:

comparing (a) an amount of energy given to said transfer unit by a heating unit configured to heat said transfer unit, to (b) an amount of energy observed to enter into said transfer unit, when a temperature of said transfer unit reaches a temperature lower than said target temperature by a predetermined amount before the temperature of said transfer unit reaches said target temperature;

calculating an amount of surplus energy from a difference between said amount of energy given to said transfer unit and said amount of energy observed to enter into said transfer unit; and cooling said transfer unit, by using a cooling unit configured to cool said transfer unit, such that said amount of surplus energy generated in said heating unit is cancelled by said cooling unit.

4. The method of controlling heating of a transfer unit of a hot press device according to claim 3, wherein said amount of surplus energy is calculated in consideration of an energy produced by radiation, an energy produced by latent heat, and an energy produced by a blowing as said amount of surplus energy, and thermal efficiency and safety factor.

* * * * *